United States Patent
Jyousaka et al.

(10) Patent No.: US 7,902,485 B2
(45) Date of Patent: Mar. 8, 2011

(54) TEMPERATURE SETTING METHOD OF THERMAL PROCESSING PLATE, TEMPERATURE SETTING APPARATUS OF THERMAL PROCESSING PLATE, PROGRAM, AND COMPUTER-READABLE RECORDING MEDIUM RECORDING PROGRAM THEREON

(75) Inventors: Megumi Jyousaka, Minato-ku (JP); Hiroshi Tomita, Minato-ku (JP); Masahide Tadokoro, Minato-ku (JP)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 11/816,191

(22) PCT Filed: Feb. 8, 2006

(86) PCT No.: PCT/JP2006/302160
§ 371 (c)(1),
(2), (4) Date: Aug. 14, 2007

(87) PCT Pub. No.: WO2006/087955
PCT Pub. Date: Aug. 24, 2006

(65) Prior Publication Data
US 2009/0008381 A1   Jan. 8, 2009

(30) Foreign Application Priority Data
Feb. 15, 2005   (JP) ................. 2005-037955

(51) Int. Cl.
*G05D 17/00* (2006.01)
*G06F 17/50* (2006.01)
(52) U.S. Cl. ............ 219/494; 219/444.1; 219/448.11; 219/448.12; 700/300

(58) Field of Classification Search ............. 118/724, 118/725, 728; 219/405, 411, 494, 497, 502, 219/444.1, 448.11, 448.12; 700/300
See application file for complete search history.

(56) References Cited

U.S. PATENT DOCUMENTS
6,072,162 A * 6/2000 Ito et al. .............. 219/444.1
(Continued)

FOREIGN PATENT DOCUMENTS
EP   1 308 783 A2   5/2003
(Continued)

OTHER PUBLICATIONS
Machine Translation of JP2003-209050.*
(Continued)

*Primary Examiner* — Tu B Hoang
*Assistant Examiner* — Brian Jennison
(74) *Attorney, Agent, or Firm* — Oblon, Spivak, McClelland, Maier & Neustadt, L.L.P.

(57) ABSTRACT

Temperature setting of a thermal plate is performed so that the line width of a resist pattern is uniformly formed within a wafer. The thermal plate of a PEB unit is divided into a plurality of thermal plate regions so that the temperature can be set for each of the thermal plate regions. A temperature correction value for adjusting the temperature within the wafer mounted on the thermal plate is set for each of the thermal plate regions of the thermal plate. The temperature correction value for each of the thermal plate regions of the thermal plate is set after calculation by a calculation model created from a correlation between a line width of the resist pattern formed by thermal processing on the thermal plate and the temperature correction value. The calculation model M calculates the temperature correction value to make the line width uniform within the wafer, based on a line width measured value of the resist pattern.

14 Claims, 12 Drawing Sheets

U.S. PATENT DOCUMENTS

2003/0054642 A1    3/2003    Kagotani et al.

FOREIGN PATENT DOCUMENTS

| | | |
|---|---|---|
| JP | 2000 82661 | 3/2000 |
| JP | 2000 349018 | 12/2000 |
| JP | 2001 168022 | 6/2001 |
| JP | 2002 184682 | 6/2002 |
| JP | 2003 209050 | 7/2003 |
| JP | 2004 235469 | 8/2004 |

OTHER PUBLICATIONS

U.S. Appl. No. 12/103,276, filed Apr. 15, 2008, Jyousaka, et al.

Search and Examination Report Dec. 19, 2008, in Singapore Patent Application No. 200705802-7 filed Feb. 8, 2006 , which encloses a Search and Examination report issued Nov. 21, 2008, in Austrian Patent Application No. 200705802-7 filed Feb. 8, 2006.

Aili Ting, "Temperature rise of the silicon mask-PMMA resist assembly during LIGA exposure," Proceedings of the SPIE - The International Society for Optical Engineering, vol. 5715, pp. 47-58 (2005); INSPEC/IEE - 9354929; *ABSTRACT*.

M. D. Smith et al., "Modeling the impact of thermal history during post exposure bake on the lithographic performance of chemically amplified resists," Proceedings of the SPIE - The International Society for Optical Engineering, vol. 4345, pp. 1013-1021 (2005); INSPEC/IEE - 7227891; *ABSTRACT*.

* cited by examiner $$\Delta CD = M \cdot \Delta T \quad \cdots (1)$$

$$M = \begin{pmatrix} a_{11}, a_{12}, a_{13} \cdots a_{1n} \\ a_{21} \\ \vdots \\ a_{m1}, a_{m2} \quad \cdots a_{mn} \end{pmatrix}$$

FIG.11
```
MEASUREMENT OF LINE WIDTH OF     — S1
RESIST PATTERN WITHIN WAFER
            ↓
CALCULATION OF TEMPERATURE
CORRECTION VALUE USING           — S2
CALCULATION MODEL
            ↓
CHANGE OF TEMPERATURE            — S3
CORRECTION VALUE
```
FIG.12
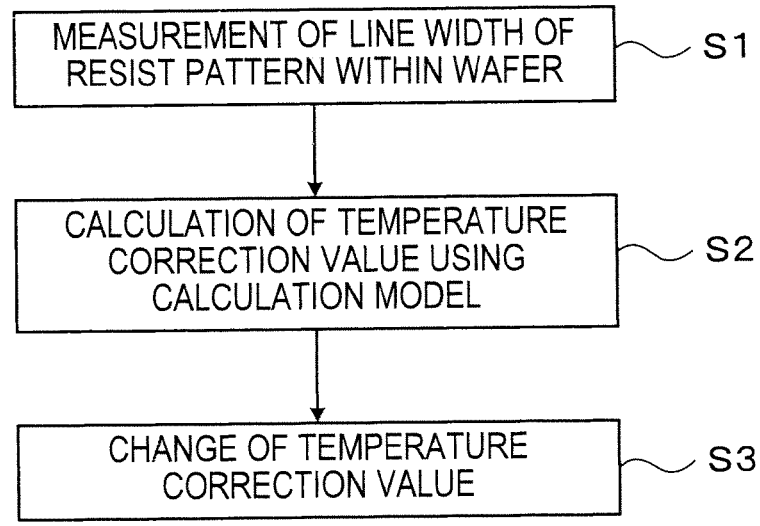
$$\begin{pmatrix} CD_1-E \\ CD_2-E \\ CD_3-E \\ CD_4-E \\ CD_5-E \end{pmatrix} = M \begin{pmatrix} \Delta T_1 \\ \Delta T_2 \\ \Delta T_3 \\ \Delta T_4 \\ \Delta T_5 \end{pmatrix} \quad \cdots\cdots (1)$$
FIG.13
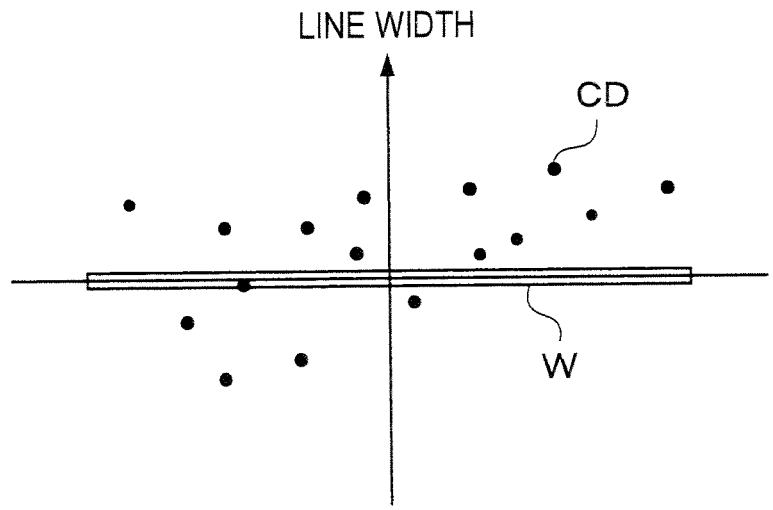

FIG.17

| PROCESSING RECIPE | CALCULATION MODEL | HEATING TEMPERATURE | RESIST SOLUTION | THERMAL PLATE TEMPERATURE CORRECTION VALUE ΔT | | | | |
|---|---|---|---|---|---|---|---|---|
| | | | | REGION R1 | REGION R2 | REGION R3 | REGION R4 | REGION R5 |
| H | M1 | T1 | B1 | a1 | a2 | a3 | a4 | a5 |
| I | M2 | T1 | B2 | b1 | b2 | b3 | b4 | b5 |
| J | M3 | T2 | B1 | c1 | c2 | c3 | c4 | c5 |
| K | M4 | T2 | B2 | d1 | d2 | d3 | d4 | d5 |

$$\Delta CD = \alpha Mt \cdot \Delta T \quad \cdots \cdots (2)$$

$$\Delta CD = \alpha Mt1 \cdot Mt2 \cdot \Delta T \quad \cdots \cdots (3)$$

$$d \geq 2 \cdot \frac{Z_{\alpha/2} \cdot \sigma}{\sqrt{n}} \quad \cdots \cdots (2)$$

TEMPERATURE SETTING METHOD OF THERMAL PROCESSING PLATE, TEMPERATURE SETTING APPARATUS OF THERMAL PROCESSING PLATE, PROGRAM, AND COMPUTER-READABLE RECORDING MEDIUM RECORDING PROGRAM THEREON

TECHNICAL FIELD

The present invention relates to a temperature setting method of a thermal processing plate, a temperature setting apparatus of a thermal processing plate, a program, and a computer-readable recording medium recording a program thereon.

BACKGROUND ART

In a photolithography process in manufacturing, for example, a semiconductor device, for example, a resist coating treatment for applying a resist solution onto a wafer to form a resist film, exposure processing for exposing the resist film into a predetermined pattern, heating processing for accelerating the chemical reaction in the resist film after exposure (post-exposure baking), and developing treatment for developing the exposed resist film are performed in sequence to form a predetermined resist pattern on the wafer.

For example, the heating processing such as the above-described post-exposure baking is usually performed in a heating processing apparatus. The heating processing apparatus includes a thermal plate for mounting and heating the wafer thereon. The thermal plate has a heater embedded therein which generates heat by power feeding, and the heat generation by the heater adjusts the thermal plate to a desired temperature.

The thermal processing temperature in the above-described heating processing greatly affects the line width of the resist pattern to be finally formed on the wafer. Hence, to strictly control the temperature within the wafer during heating, the thermal plate of the above-described heating processing apparatus is divided into a plurality of regions, and an independent heater is embedded in each of the regions to adjust the temperature for each of the regions.

However, if the temperature adjustment for all of the regions of the above-described thermal plate is performed at the same set temperature, the temperature may vary within the wafer on the thermal plate, for example, due to the difference in thermal resistance between the regions. For this reason, the set temperatures for the regions of the thermal plate are subjected to temperature correction (temperature offset), and the temperature correction values for the regions are set to make the temperature uniform within the wafer (see Patent Document 1).
[Patent Document]
Japanese Patent Application Laid-open No. 2001-143850

DISCLOSURE OF THE INVENTION

Problems to be Solved by the Invention

However, even if the temperature correction values are set to make the temperature uniform within the wafer as in the prior art, the line width of the resist pattern to be finally formed on the wafer is actually not formed uniform within the wafer.

The present invention has been developed in consideration of the above viewpoints, and its object is to perform the temperature setting of a thermal processing plate such as a thermal plate so that the line width of a resist pattern is made uniform within a substrate such as a wafer.

Means for Solving the Problems

To attain the above object, the present invention is a temperature setting method of a thermal processing plate for mounting and thermally processing a substrate thereon, wherein the thermal processing is performed in a photolithography process of forming a resist pattern on the substrate, wherein the thermal processing plate is divided into a plurality of regions and temperature-set for each of the regions, and wherein a temperature correction value for adjusting a temperature within the substrate on the thermal processing plate is set for each of the regions of the thermal processing plate. The temperature correction value for each of the regions is set after calculation by a calculation model created from a correlation between a line width of the resist pattern formed by thermal processing on the thermal processing plate and the temperature correction value. The calculation model calculates the temperature correction value to make the line width uniform within the substrate, based on a line width measured value of the resist pattern within the substrate.

According to the present invention, the temperature correction value for each of the regions of the thermal processing plate is calculated by a calculation model created from a correlation between a line width of the resist pattern and the temperature correction value so that the line width of the resist pattern is uniform within the substrate, and set. As a result, the resist pattern formed by the thermal processing on the thermal processing plate is uniformly formed within the substrate.

Variation tendency components may be obtained from a tendency of variations in the line width measured values within the substrate presented by describing, in a height direction, the line width measured values at a plurality of line width measurement points within the substrate, the variation tendency components including a gradient component in an X-direction within the substrate, a gradient component in a Y-direction perpendicular to the X-direction within the substrate, and a curvature component within the substrate, and the calculation model may calculate the temperature correction value to decrease the variation tendency components. In this case, the plurality of line width measured values within the substrate are converted into three variation tendency components, and the temperature correction value is calculated to decrease the variation tendency components, thus allowing for easy calculation of the temperature correction value to make the resist pattern uniform within the substrate.

The gradient component in the X-direction and the gradient component in the Y-direction may be found by a least square method from the plurality of line width measured values within the substrate, and the curvature component may be found by subtracting the gradient component in the X-direction and the gradient component in the Y-direction from the tendency of the line width measured values within the substrate.

The calculation model may be separated into one model component determined by a resist solution and another model component determined by a processing condition other than the resist solution. In this case, if the resist solution is changed, it is only required to change the one model component affected by the resist solution, so that the change of the resist solution can be easily and rapidly responded.

The other model component may be further separated into a first model component determined by an exposure processing condition in the photolithography process and a second model component determined by a processing condition other than the exposure processing condition.

The temperature correction value for each of the region may be set for each processing recipe determined by a combination of at least a thermal processing temperature and a kind of the resist solution. In this case, when either the thermal processing temperature or the kind of the resist solution which affect the line width of the resist pattern is changed, the temperature correction value for each of the region is changed. As a result, the heating processing is always performed at an appropriate in-plane temperature, so that the line width of the resist pattern to be finally formed is uniformly formed within the substrate.

The thermal processing may be heating processing performed after exposure processing and before a developing treatment.

The present invention according to another aspect is a temperature setting apparatus of a thermal processing plate for mounting and thermally processing a substrate thereon, wherein the thermal processing is performed in a photolithography process of forming a resist pattern on the substrate, wherein the thermal processing plate is divided into a plurality of regions and temperature-set for each of the regions, and wherein a temperature correction value for adjusting a temperature within the substrate on the thermal processing plate is set for each of the regions of the thermal processing plate. The temperature correction value for each of the regions is set after calculation by a calculation model created from a correlation between a line width of the resist pattern formed by thermal processing on the thermal processing plate and the temperature correction value. The calculation model is capable of calculating the temperature correction value to make the line width uniform within the substrate, based on a line width measured value of the resist pattern.

According to the present invention, the temperature correction value for each of the regions of the thermal processing plate is calculated by a calculation model created from a correlation between a line width of the resist pattern and the temperature correction value so that the line width of the resist pattern is uniform within the substrate, and set. As a result, the resist pattern formed by the thermal processing on the thermal processing plate is uniformly formed within the substrate.

Variation tendency components may be obtained from a tendency of variations in the line width measured values within the substrate presented by describing, in a height direction, the line width measured values at a plurality of line width measurement points within the substrate, the variation tendency components including a gradient component in an X-direction within the substrate, a gradient component in a Y-direction perpendicular to the X-direction within the substrate, and a curvature component within the substrate, and the calculation model may be capable of calculating the temperature correction value to decrease the variation tendency components.

The gradient component in the X-direction and the gradient component in the Y-direction may be found by a least square method from the plurality of line width measured values within the substrate, and the curvature component may be found by subtracting the gradient component in the X-direction and the gradient component in the Y-direction from the tendency of the line width measured values within the substrate.

The calculation model may be separated into one model component determined by a resist solution and another model component determined by a processing condition other than the resist solution.

The other model component may be further separated into a first model component determined by an exposure processing condition in the photolithography process and a second model component determined by a processing condition other than the exposure processing condition.

The temperature correction value for each of the regions may be set for each processing recipe determined by a combination of at least a thermal processing temperature and a kind of the resist solution.

The thermal processing may be heating processing performed after exposure processing and before a developing treatment.

According to the present invention in another aspect, the present invention is a program for use in a temperature setting apparatus for performing, on a thermal processing plate, thermal processing of a substrate performed in a photolithography process of forming a resist pattern, wherein the thermal processing plate is divided into a plurality of regions and temperature-settable for each of the regions, and a temperature correction value for adjusting a temperature within the substrate on the thermal processing plate is set for each of the regions of the thermal processing plate. The program causes a computer to execute calculation of the temperature correction value for each of the regions by a calculation model created from a correlation between a line width of the resist pattern formed by thermal processing on the thermal processing plate and the temperature correction value. The calculation model is capable of calculating the temperature correction value to make the line width uniform within the substrate, based on a line width measured value of the resist pattern.

Such a program of the present invention is recorded, for example, on a computer-readable recording medium, such as a hard disk, a compact disk, a magneto-optical disk, a floppy disk, and the like.

Effect of the Invention

According to the present invention, the uniformity within the substrate of the line width of the resist pattern to be finally formed on the substrate within the substrate can be ensured to increase yields.

A plan view showing a configuration of a thermal plate in the PEB unit.

[FIG. 8]

A block diagram showing a configuration of a temperature setting apparatus.

[FIG. 9]

A relational expression between the line width variation amount and the temperature correction value using a calculation model.

[FIG. 10]

A determinant showing an example of the calculation model.

[FIG. 11]

A flowchart showing a temperature setting process.

[FIG. 12]

Figures 8, 9, 10:
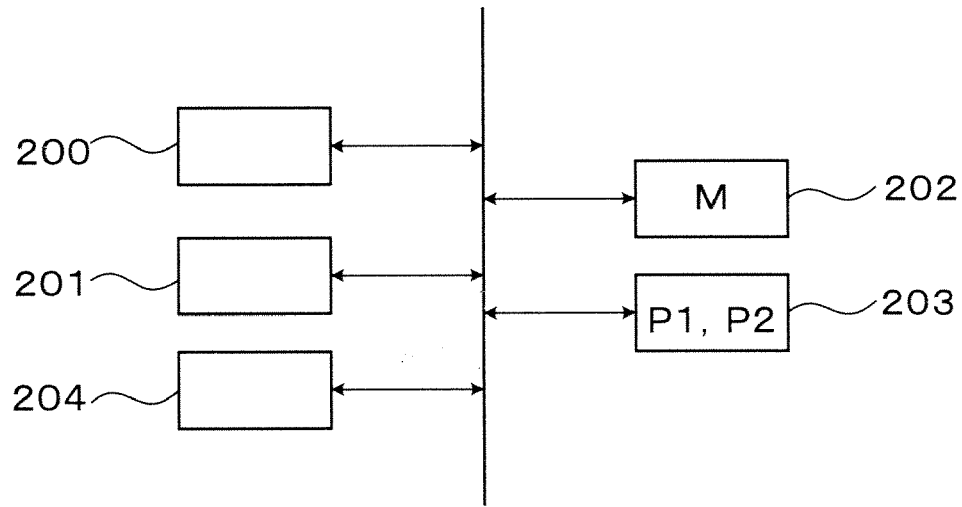

An example of substituting line width measured values of wafer regions into the relational expression in FIG. 9.

[FIG. 13]

A view showing a tendency of variations in the line width measured values.

[FIG. 14]

A view showing a gradient component in an X-direction of the tendency of variations in the line width measured values.

[FIG. 15]

A view showing a gradient component in a Y-direction of the tendency of variations in the line width measured values.

[FIG. 16]

A view showing a curvature component of the tendency of variations in the line width measured values.

[FIG. 17]

A table showing a temperature correction table when setting the calculation model and the temperature correction value for each processing recipe.

[FIG. 18]

A relational expression between the line width variation amount and the temperature correction value when separating the calculation model into a model component relating to a resist solution and another model component.

[FIG. 19]

A relational expression between the line width variation amount and the temperature correction value when further separating the model component other than the resist solution into a model component relating to exposure processing and another model component.

[FIG. 20]

An enlarged view at a measurement point of the line width.

[FIG. 21]

A theoretical expression for calculating the measurement error.

EXPLANATION OF CODES 1 coating and developing treatment system
84 PEB unit
140 thermal plate
142 temperature controller
190 temperature setting apparatus
R1 to R5 thermal plate region
W1 to W5 wafer region
M calculation model
W wafer

BEST MODE FOR CARRYING OUT THE INVENTION

Figure 1:
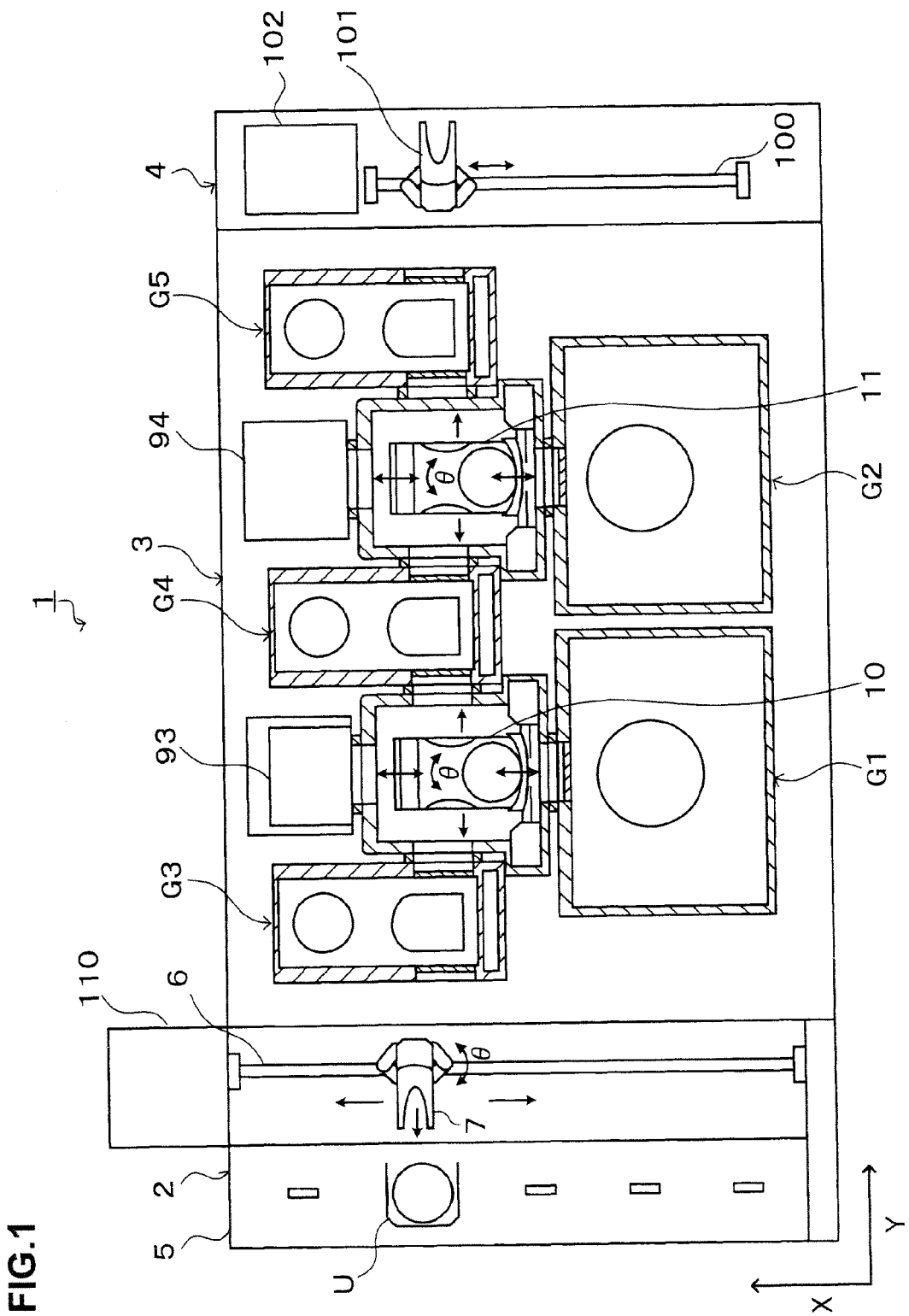
[FIG. 1]
A plan view showing the outline of a configuration of a coating and developing treatment system.
Figure 2:
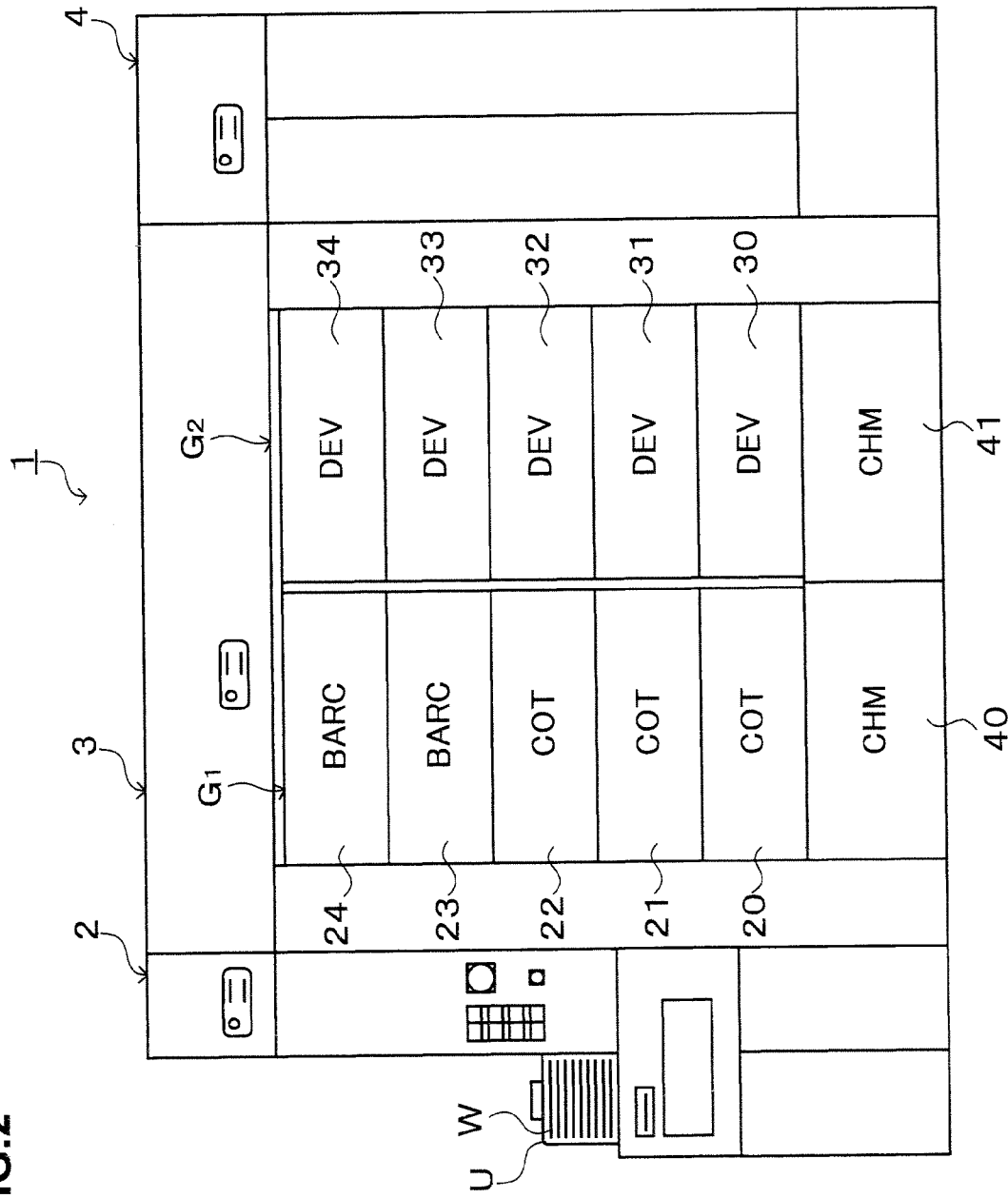
[FIG. 2]
A front view of the coating and developing treatment system in FIG. 1.
Figure 3:
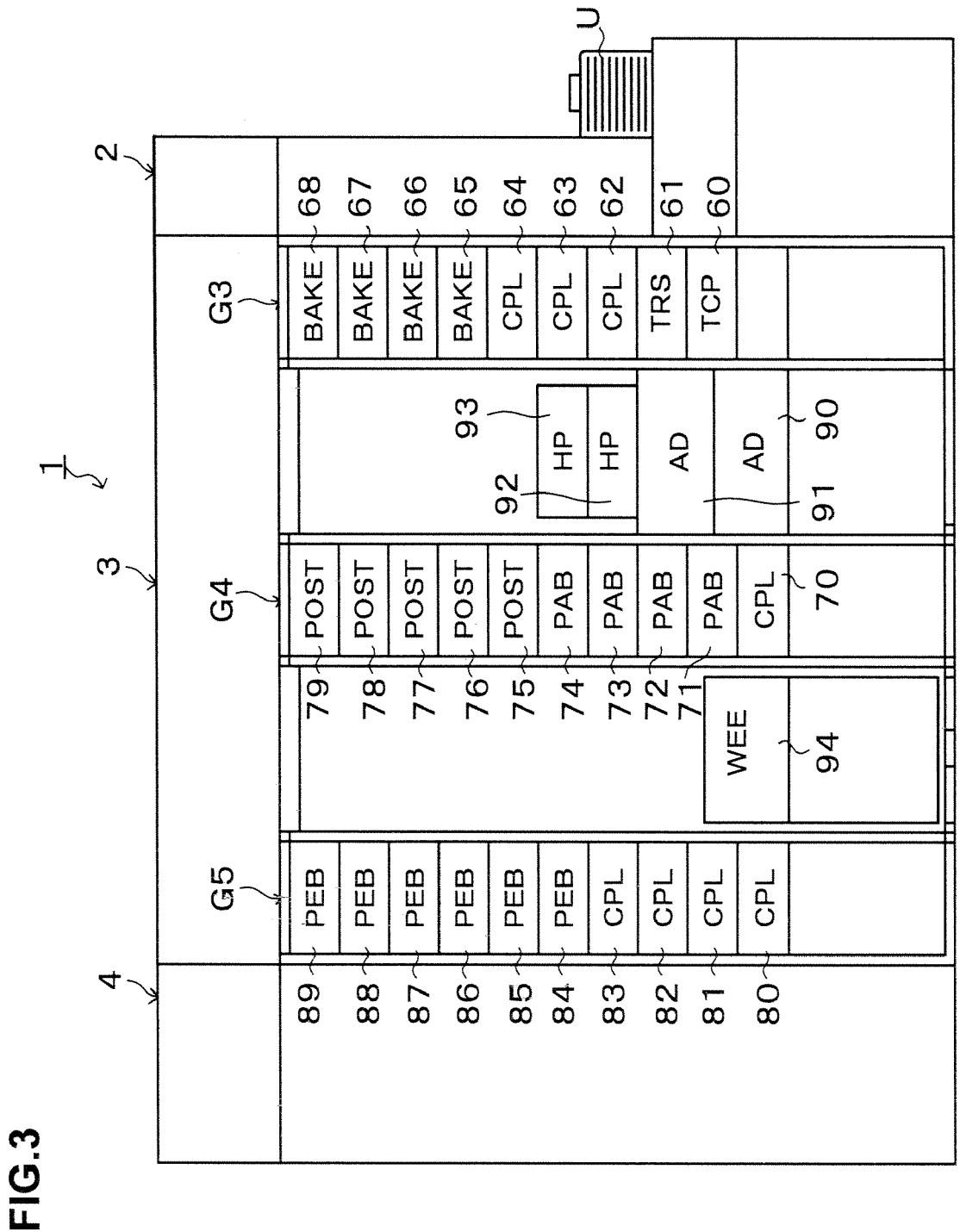
[FIG. 3]
A rear view of the coating and developing treatment system in FIG. 1.

Hereinafter, a preferred embodiment of the present invention will be described. FIG. 1 is a plan view showing the outline of a configuration of a coating and developing treatment system 1 incorporating a temperature setting apparatus of a thermal processing plate according to the embodiment, FIG. 2 is a front view of the coating and developing treatment system 1, and FIG. 3 is a rear view of the coating and developing treatment system 1.

The coating and developing treatment system 1 has, as shown in FIG. 1, a configuration in which, for example, a cassette station 2 for transferring, for example, 25 wafers W per cassette as a unit from/to the outside into/from the coating and developing treatment system 1 and transferring the wafers W into/out of a cassette C; a processing station 3 including a plurality of various kinds of processing and treatment units, which are multi-tiered, for performing predetermined processing or treatment in a manner of single wafer processing in the photolithography process; and an interface section 4 for delivering the wafers W to/from a not-shown aligner provided adjacent to the processing station 3, are integrally connected together.

In the cassette station 2, a cassette mounting table 5 is provided which is capable of mounting a plurality of cassettes U thereon in a line in an X-direction (a top-to-bottom direction in FIG. 1). In the cassette station 2, a wafer transfer body 7 is provided which is movable in the X-direction on a transfer path 6. The wafer transfer body 7 is also movable in a wafer-arrangement direction of the wafers W housed in the cassette U (a Z-direction; the vertical direction), and thus can selectively access the wafers W in each of the cassettes U arranged in the X-direction.

The wafer transfer body 7, which is rotatable in a θ-direction around the Z-axis, can access a temperature regulating unit 60 and a transition unit 61 included in a later-described third processing unit group G3 on the processing station 3 side.

The processing station 3 adjacent to the cassette station 2 includes, for example, five processing unit groups G1 to G5 in each of which a plurality of processing and treatment units are multi-tiered. On the side of the negative direction in the X-direction (the downward direction in FIG. 1) in the processing station 3, the first processing unit group G1 and the second processing unit group G2 are placed in order from the cassette station 2 side. On the side of the positive direction in the X-direction (the upward direction in FIG. 1) in the processing station 3, the third processing unit group G3, the fourth processing unit group G4, and the fifth processing unit group G5 are placed in order from the cassette station 2 side. Between the third processing unit group G3 and the fourth processing unit group G4, a first transfer unit 10 is provided. The first transfer unit 10 can selectively access the processing and treatment units in the first processing unit group G1, the third processing unit group G3, and the fourth processing unit group G4 and transfer the wafer W to them. Between the fourth processing unit group G4 and the fifth processing unit group G5, a second transfer unit 11 is provided. The second transfer unit 11 can selectively access the processing and treatment units in the second processing unit group G2, the fourth processing unit group G4, and the fifth processing unit group G5 and transfer the wafer W to them.

In the first processing unit group G1, as shown in FIG. 2, solution treatment units each for supplying a predetermined liquid to the wafer W to perform treatment, for example, resist coating units 20, 21, and 22 each for applying a resist solution to the wafer W, and bottom coating units 23 and 24 each for forming an anti-reflection film that prevents reflection of light at the time of exposure processing, are five-tiered in order from the bottom. In the second processing unit group G2, solution treatment units, for example, developing treatment units 30 to 34 each for supplying a developing solution to the wafer W to develop it are five-tiered in order from the bottom. Further, chemical chambers 40 and 41 each for supplying various kinds of treatment solutions to the solution treatment units in the processing unit groups G1 and G2 are provided at the lowermost tiers of the first processing unit group G1 and the second processing unit group G2, respectively.

As shown in FIG. 3, in the third processing unit group G3, for example, the temperature regulating unit 60, the transition unit 61 for passing the wafer W, high-precision temperature regulating units 62 to 64 each for temperature-regulating the wafer W under temperature control with a high precision, and high-temperature thermal processing units 65 to 68 each for heating-processing the wafer W at a high temperature, are nine-tiered in order from the bottom.

In the fourth processing unit group G4, for example, a high-precision temperature regulating unit 70, pre-baking units 71 to 74 each for heating-processing the wafer W after resist coating treatment, and post-baking units 75 to 79 each for heating-processing the wafer W after developing treatment, are ten-tiered in order from the bottom.

In the fifth processing unit group G5, a plurality of thermal processing units each for thermally processing the wafer W, for example, high-precision temperature regulating units 80 to 83, and a plurality of post-exposure baking units (hereinafter, referred to as "PEB units") 84 to 89 each for heating-processing the wafer W after exposure, are ten-tiered in order from the bottom.

As shown in FIG. 1, on the side of the positive direction in the X-direction of the first transfer unit 10, a plurality of processing and treatment units are arranged, for example, adhesion units 90 and 91 each for performing hydrophobic treatment on the wafer W and heating units 92 and 93 each for heating the wafer W being four-tiered in order from the bottom as shown in FIG. 3. As shown in FIG. 1, on the side of the positive direction in the X-direction of the second transfer unit 11, for example, an edge exposure unit 94 is disposed which selectively exposes only the edge portion of the wafer W to light.

In the interface section 4, for example, a wafer transfer body 101 moving on a transfer path 100 extending in the X-direction and a buffer cassette 102 are provided as shown in FIG. 1. The wafer transfer body 101 is movable in the Z-direction and also rotatable in the θ-direction and thus can access the not-shown aligner adjacent to the interface section 4, the buffer cassette 102, and the fifth processing unit group G5 and transfer the wafer W to them.

Figure 4:
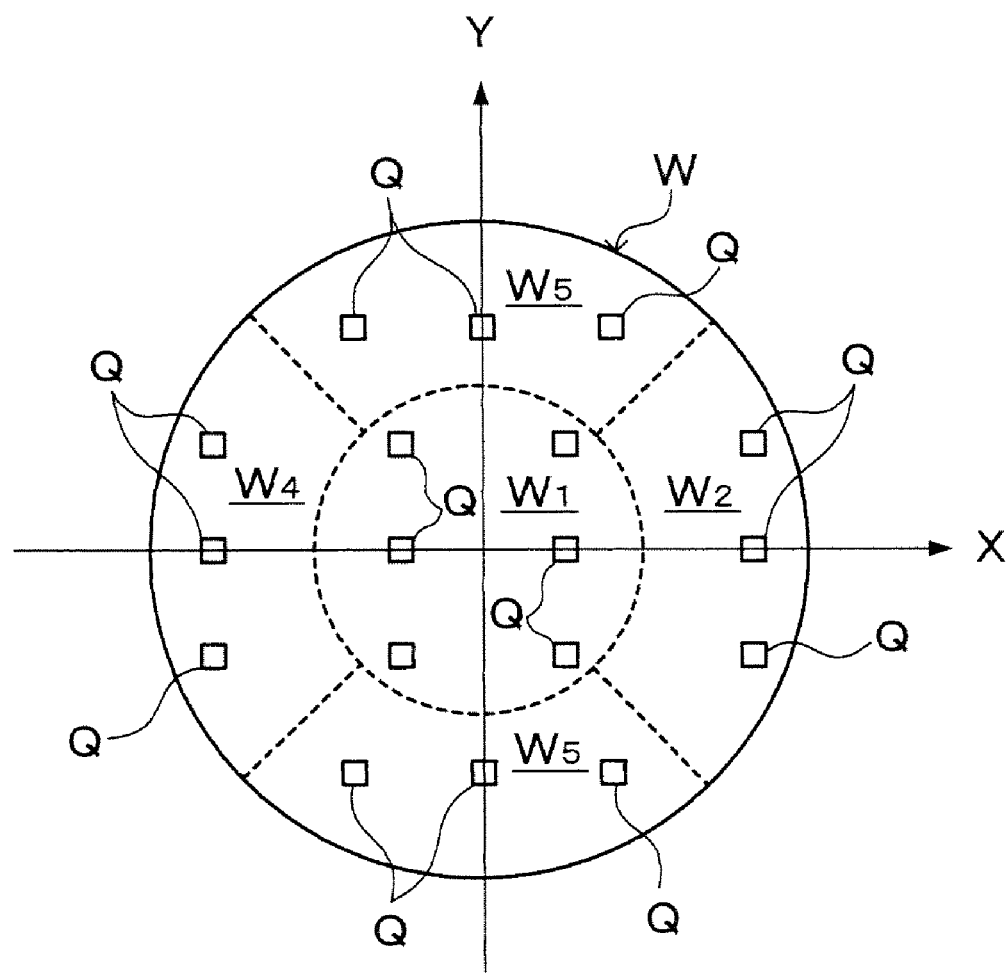
[FIG. 4]
An explanatory view showing measurement points of the line width within a wafer.

In the cassette station 2, for example, a line width measuring unit 110 for measuring the line width of a resist pattern on the wafer W is provided. The line width measuring unit 110 can apply, for example, electron beams to the wafer W and capture the image of the surface of the wafer W to measure the line width of the resist pattern within the wafer. The line width measuring unit 110 can measure the line width at a plurality of locations within the wafer W. The line width measuring unit 110 can measure, for example, the line width at a plurality of measurement points Q of wafer regions $W_1$ to $W_5$ made by dividing the wafer W into a plurality of regions as shown in FIG. 4. The wafer regions $W_1$ to $W_5$ correspond to thermal plate regions $R_1$ to $R_5$ of a later-described thermal plate 140 of the PEB unit 84.

In the coating and developing treatment system 1, unprocessed wafers W are first taken out by the wafer transfer body 7 one by one from the cassette U on the cassette mounting table 5, and transferred to the temperature regulating unit 60 in the third processing unit group G3. The wafer W transferred to the temperature regulating unit 60 is temperature-regulated to a predetermined temperature, and is then transferred by the first transfer unit 10 to the bottom coating unit 23 where an anti-reflection film is formed. The wafer W having the anti-reflection film formed thereon is transferred by the first transfer unit 10 to the heating unit 92, the high-temperature thermal processing unit 65, and the high-precision temperature regulating unit 70 in sequence so that predetermined processing is performed in each of the units. Thereafter, the wafer W is transferred to the resist coating unit 20 where a resist film is formed on the wafer W, and then transferred by the first transfer unit 10 to the pre-baking unit 71, and is subsequently transferred by the second transfer unit 11 to the edge exposure unit 94 and the high-precision temperature regulating unit 83 in sequence so that the wafer W is subjected to predetermined processing in each of the units. The wafer W is then transferred by the wafer transfer body 101 in the interface section 4 to the not-shown aligner where the wafer is exposed to light. The wafer W for which exposure processing has been finished is transferred by the wafer transfer body 101, for example, to the PEB unit 84 where the wafer W is subjected to post-exposure baking processing, and then transferred by the second transfer unit 11 to the high-precision temperature regulating unit 81 where the wafer W is temperature-regulated. The wafer W is transferred to the developing treatment unit 30 where the resist film on the wafer W is developed. The wafer W is then transferred by the second transfer unit 11 to the post-baking unit 75 where the wafer W is subjected to heating-processing and then transferred to the high-precision temperature regulating unit 63 where the wafer W is temperature-regulated. The wafer W is then transferred by the first transfer unit 10 to the transition unit 61 and returned to the cassette U by the wafer transfer body 7, thus completing a series of steps of the photolithography process.

Figure 5:
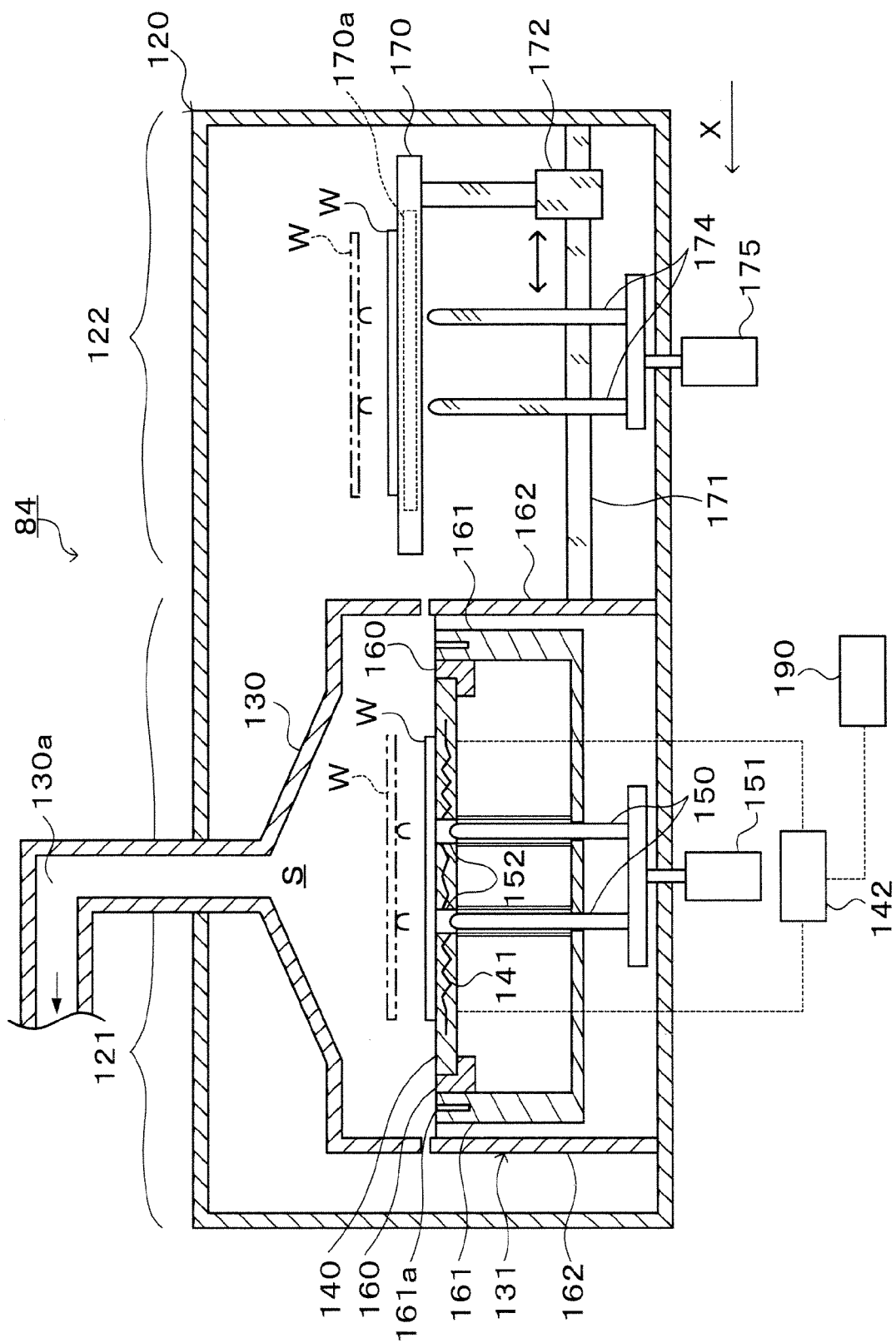
[FIG. 5]
An explanatory view of a longitudinal section showing the outline of a configuration of a PEB unit.
Figure 6:
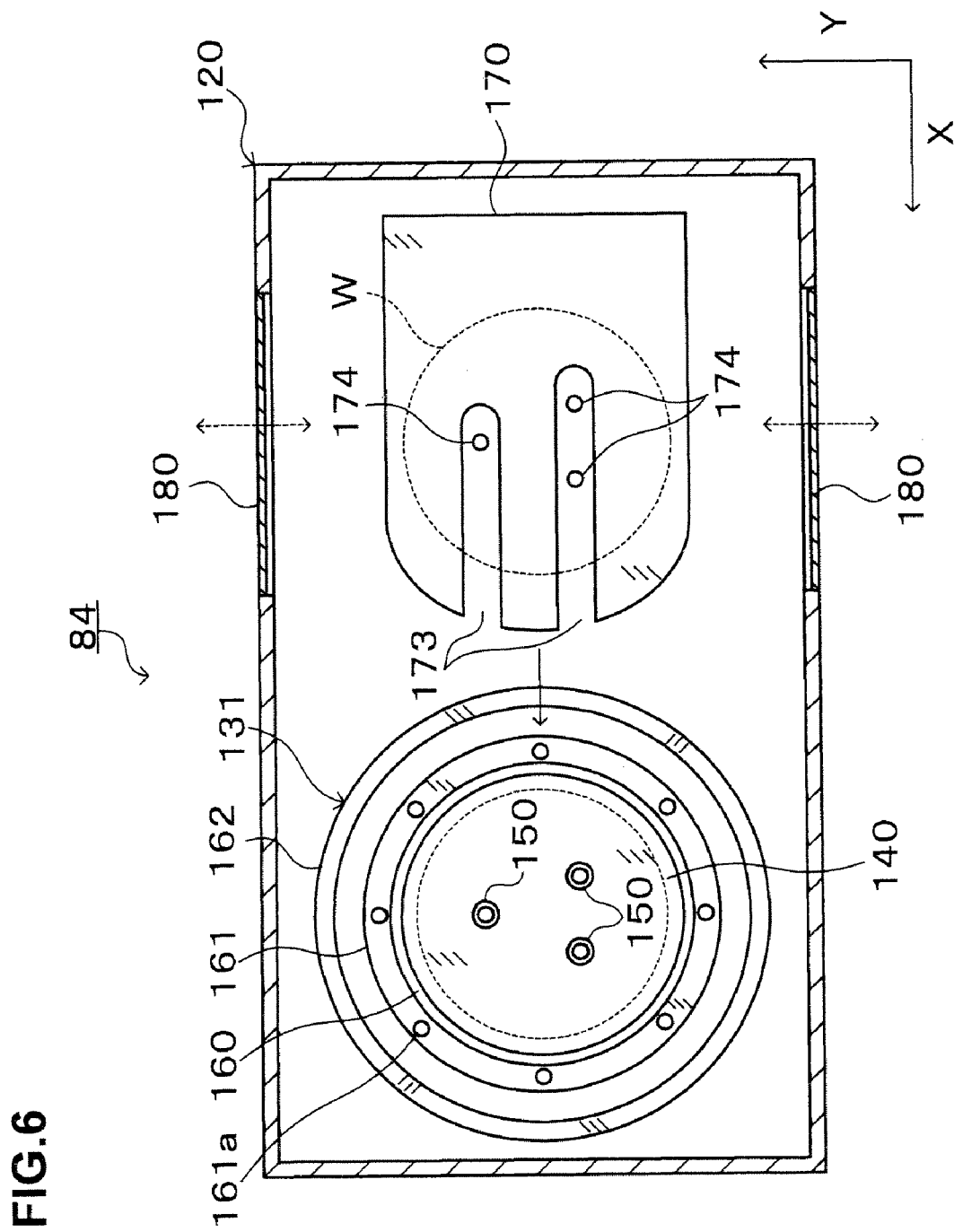
[FIG. 6]
An explanatory view of a transverse section showing the outline of a configuration of the PEB unit.

Next, the configuration of the aforementioned PEB unit 84 will be described. As shown in FIG. 5 and FIG. 6, the PEB unit 84 comprises a heating section 121 for heating-processing the wafer W and a cooling section 122 for cooling-processing the wafer W in a housing 120.

The heating section 121 has, as shown in FIG. 5, a lid body 130 that is located on the upper side and vertically movable, and a thermal plate accommodating unit 131 that is located on the lower side and forms a processing chamber S together with the lid body 130.

The lid body 130 has an almost conical shape gradually increasing in height toward its central portion, and is provided with an exhaust portion 130a at its top portion. The atmosphere in the processing chamber S is uniformly exhausted through the exhaust portion 130a.

At the center of the thermal plate accommodating unit 131, a thermal plate 140 is provided as a thermal processing plate for mounting and heating the wafer W thereon. The thermal plate 140 has an almost disk shape with a large thickness.

Figure 7:
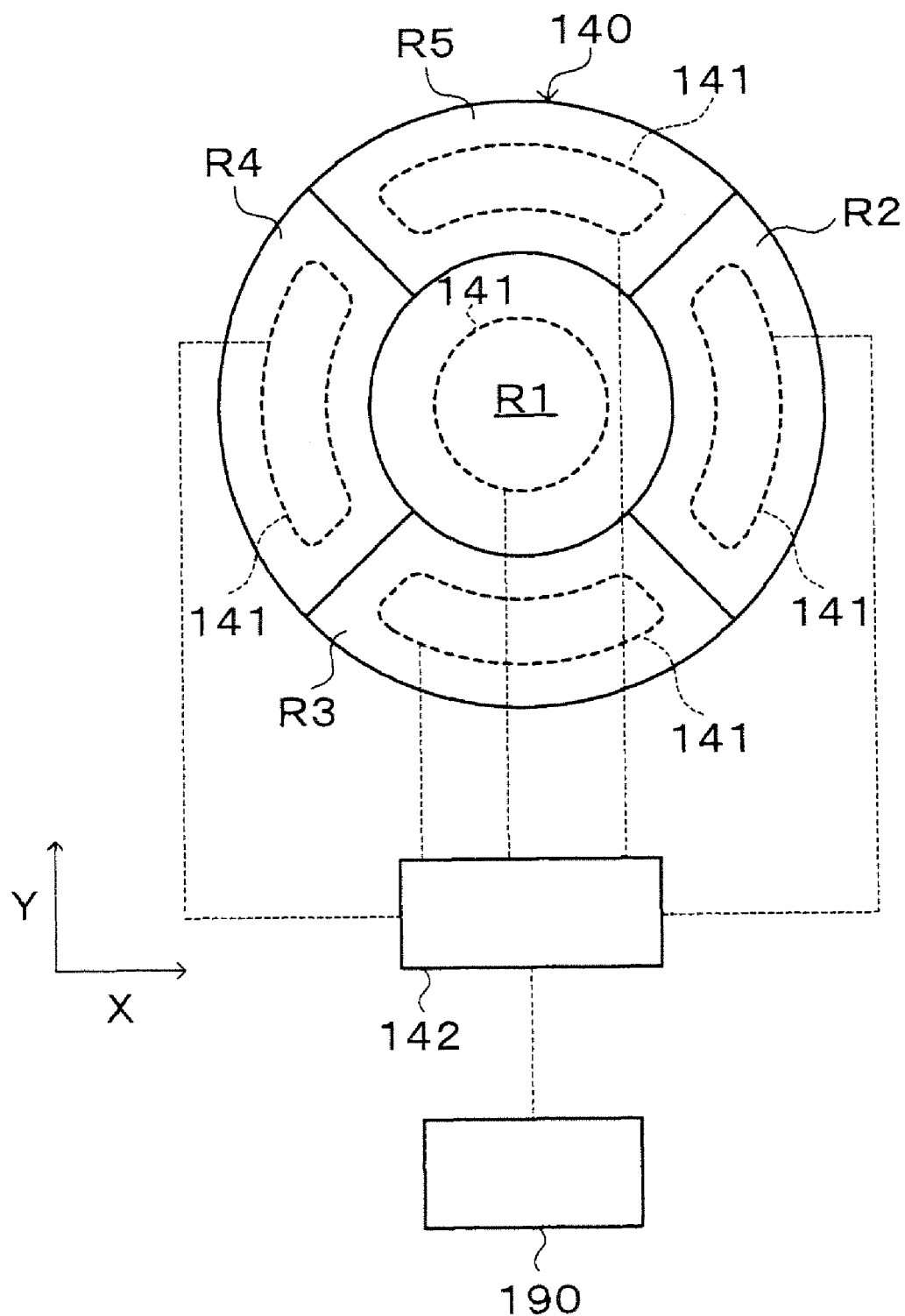
[FIG. 7]

The thermal plate 140 is divided into a plurality of, for example, five thermal plate regions $R_1$, $R_2$, $R_3$, $R_4$ and $R_5$ as shown in FIG. 7. The thermal plate 140 is divided, for example, into the circular thermal plate region $R_1$ which is located at the central portion as seen in plan view and the thermal plate regions $R_2$ to $R_5$ which are made by equally dividing the peripheral portion around the thermal plate region $R_1$ into four sectors.

A heater 141 generating heat by power feeding is individually embedded in each of the thermal plate regions $R_1$ to $R_5$ of the thermal plate 140 and can heat each of the thermal plate regions $R_1$ to $R_5$. The heating value of each of the heaters 141 of the thermal plate regions $R_1$ to $R_5$ is adjusted, for example, by a temperature controller 142. The temperature controller 142 can adjust the heating value of the heater 141 to control the temperature of each of the thermal plate regions $R_1$ to $R_5$ to a predetermined temperature. The temperature control in the temperature controller 142 is performed, for example, by a later-described temperature setting apparatus 190.

As shown in FIG. 5, first raising and lowering pins 150 for supporting the wafer W from below and raising and lowering the wafer W are provided below the thermal plate 140. The first raising and lowering pins 150 are vertically movable by means of a raising and lowering drive mechanism 151. Near the central portion of the thermal plate 140, through holes 152 are formed which pass through the thermal plate 140 in its thickness direction. The first raising and lowering pins 150 can rise from below the thermal plate 140 and pass through the through holes 152 to project to above the thermal plate 140.

The thermal plate accommodating unit 131 has an annular holding member 160 for accommodating the thermal plate 140 and holding the outer peripheral portion of the thermal plate 140, and a support ring 161 almost in a cylindrical shape surrounding the outer periphery of the holding member 160. The upper surface of the support ring 161 is formed with blow ports 161a for jetting, for example, an inert gas toward the inside of the processing chamber S. The jetting of the inert gas from the blow ports 161a can purge the processing chamber S. Further, outside the support ring 161, a case 162 in a cylindrical shape is provided which is an outer periphery of the thermal plate accommodating unit 131.

In the cooling section 122 adjacent to the heating section 121, for example, a cooling plate 170 is provided which mounts and cools the wafer W thereon. The cooling plate 170 has, for example, an almost square flat-plate shape as shown in FIG. 6 with its end face on the heating section 121 side curved in an arc shape. As shown in FIG. 5, inside the cooling plate 170, for example, a cooling member 170a such as a Peltier element is embedded and can adjust the cooling plate 170 to a predetermined set temperature.

The cooling plate 170 is attached to a rail 171 extending toward the heating section 121 side. The cooling plate 170 can move on the rail 171 by means of a drive unit 172. The cooling plate 170 can move to a position above the thermal plate 140 on the heating section 121 side.

The cooling plate 170 is formed with, for example, two slits 173 along the X-direction, for example, as shown in FIG. 6. The slits 173 are formed from the end surface on the heating section 121 side of the cooling plate 170 to the vicinity of the central portion of the cooling plate 170. The slits 173 prevent the cooling plate 170 which has moved to the heating section 121 side from interfering with the first raising and lowering pins 150 projecting to above the thermal plate 140. As shown in FIG. 5, second raising and lowering pins 174 are provided below the slits 173 in the cooling section 122. The second raising and lowering pins 174 can be raised and lowered by a raising and lowering drive unit 175. The second raising and lowering pins 174 can rise from below the cooling plate 170 and pass through the slits 173 to project to above the cooling plate 170.

As shown in FIG. 6, both side surfaces of the housing 120 across the cooling plate 170 are formed with transfer-in/out ports 180 for transferring-in/out the wafer W.

In the PEB unit 84 configured as described above, a wafer W is first transferred-in through the transfer-in/out port 180 and mounted on the cooling plate 170. The cooling plate 170 is subsequently moved so that the wafer W is moved to a position above the thermal plate 140. The wafer W is mounted onto the thermal plate 140 by the first raising and lowering pins 150, so that the wafer W is heated. After a lapse of a predetermined time, the wafer W is then passed from the thermal plate 140 again to the cooling plate 170 to be cooled, and transferred from the cooling plate 170 to the outside of the PEB unit 84 through the transfer-in/out port 180, with which a series of thermal processing ends.

Next, the configuration of the temperature setting apparatus 190 for performing temperature setting of the thermal plate 140 in the above-described PEB unit 84 will be described. The temperature setting apparatus 190 is composed of, for example, a general-purpose computer comprising a CPU and a memory, and connected to the temperature controller 142 of the thermal plate 140 as shown in FIG. 5 and FIG. 7.

The temperature setting apparatus 190 comprises, for example, as shown in FIG. 8, a computing unit 200 for executing various kinds of programs; an input unit 201 for inputting, for example, various kinds of information for temperature setting; a data storage unit 202 for storing various kinds of information such as a calculation model M for calculating a temperature correction value; a program storage unit 203 for storing various kinds of programs for temperature setting; and a communication unit 204 for communicating with the temperature controller 142 to change the temperature setting of the thermal plate 140.

For example, the program storage unit 202 stores, for example, a calculation model M. The calculation model M is a correlation model expressed by a relational expression (1) between the line width variation amount $\Delta CD$ of the resist pattern and the temperature correction value $\Delta T$, for example, as shown in FIG. 9. The calculation model M can calculate an optimal temperature correction value $\Delta T$ for each of the thermal plate regions $R_1$ to $R_5$ based on the line width measured values of the resist pattern formed in the coating and developing treatment system 1, that is, a temperature correction value $\Delta T$ so that the line width of the resist pattern finally becomes uniform within the wafer.

The calculation model M is, for example, a determinant shown in FIG. 10 and, for example, element $a_{i,j}$ of the determinant are obtained by measuring the line width variation amounts of the wafer regions $W_1$ to $W_5$ when the temperature of an arbitrary thermal plate region of the plurality of thermal plate regions $R_1$ to $R_5$ is changed by 1° C., for all of combinations.

The program storage unit 203 stores, as shown in FIG. 8, for example, a program P1 to calculate the temperature correction value $\Delta T$ of each of the thermal plate regions $R_1$ to $R_5$ using the relational expression (1) of the calculation model M, a program P2 to change the existing temperature setting in the temperature controller 142 based on the calculated temperature correction value $\Delta T$, and so on. Note that the various kinds of programs for embodying the functions of the temperature setting apparatus 190 may be ones installed in the temperature setting apparatus 190 by a computer-readable recording medium.

Next, the temperature setting process by the temperature setting apparatus 190 configured as described above will be described. FIG. 11 shows a flow of the temperature setting process.

First of all, the wafer W for which a series of photolithography process steps has been finished in the coating and developing treatment system 1 is transferred into the line width measuring unit 110 where the line width of the resist pattern on the wafer W is measured (Step S1 in FIG. 11). In this event, the line width is measured at a plurality of measurement points Q within the wafer to obtain the line widths in the wafer regions $W_1$ to $W_5$ corresponding to the thermal plate regions $R_1$ to $R_5$ of the thermal plate 140.

Subsequently, the result of the line width measurement in the line width measuring unit 110 is outputted to the temperature setting apparatus 190. In the temperature setting apparatus 190, an optimum temperature correction value $\Delta T$ is calculated by the calculation model M, for example, based on the line width measured value of each of the wafer region $W_1$ to $W_5$ (Step S2 in FIG. 11). For example, as shown in FIG. 12, each of the temperature correction values $\Delta T_1$, $\Delta T_2$, $\Delta T_3$, $\Delta T_4$, and $\Delta T_5$ for the thermal plate regions $R_1$ to $R_5$ is calculated by substituting the difference between the average line width E that is the target line width and each of the measured line with values $CD_1$, $CD_2$, $CD_3$, $CD_4$, and $CD_5$ of the wafer regions $W_1$ to $W_5$ into the line width variation amount $\Delta CD$ in the relational expression (1).

Then, the information on each of the temperature correction values $\Delta T_1$ to $\Delta T_5$ is outputted from the communication unit 204 to the temperature controller 142, and the temperature correction value for each of the thermal plate regions $R_1$ to $R_5$ of the thermal plate 140 in the temperature controller 142 is changed, so that a new set temperature is set (Step S3 in FIG. 11).

According to the above embodiment, the calculation model M created from the correlation between the temperature correction value and the line width is used to calculate the temperature correction values $\Delta T$ for the regions $R_1$ to $R_5$ so that the line width becomes uniform within the wafer. As a result, the line width of the resist pattern is formed uniform within the wafer in the photolithography process in the coating and developing treatment system 1.

Incidentally, the line width measuring unit 110 obtains the line width measured values at the plurality of measurement points Q within the wafer. When the numerical value of the line width measurement at each of the measurement points Q is described in the height direction and projected on the plane vertical to the wafer surface, a tendency of variations in the line width measured values CD within the wafer is shown as shown in FIG. 13. The temperature correction value $\Delta T$ in the above embodiment may be set such that the gradient component in the X-direction, the gradient component in the Y-direction, and the curvature component within the wafer of the tendency of variations in the line width measured values within the wafer are obtained, and the variation tendency components are decreased. Note that in this embodiment, the X-axis is set to pass through the wafer regions $W_4$, $W_1$, and $W_2$ on the diameter of the wafer W and the Y-axis is set to pass through the wafer regions $W_3$, $W_1$, and $W_5$ on the diameter of the wafer W as shown in FIG. 4.

Figure 14:
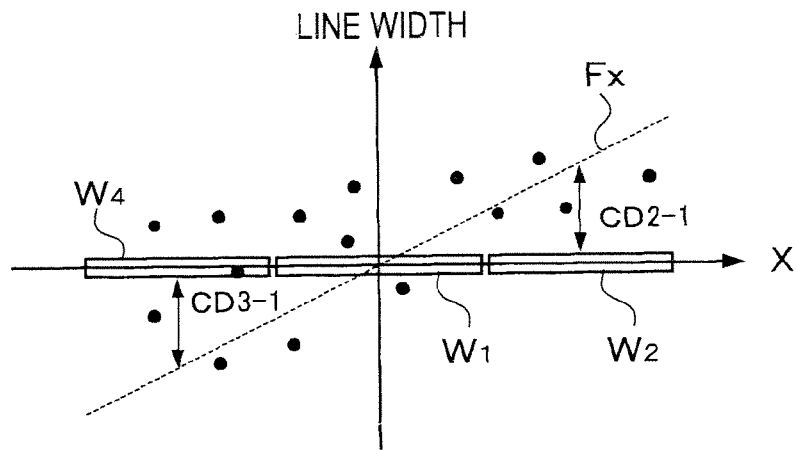
Figure 15:
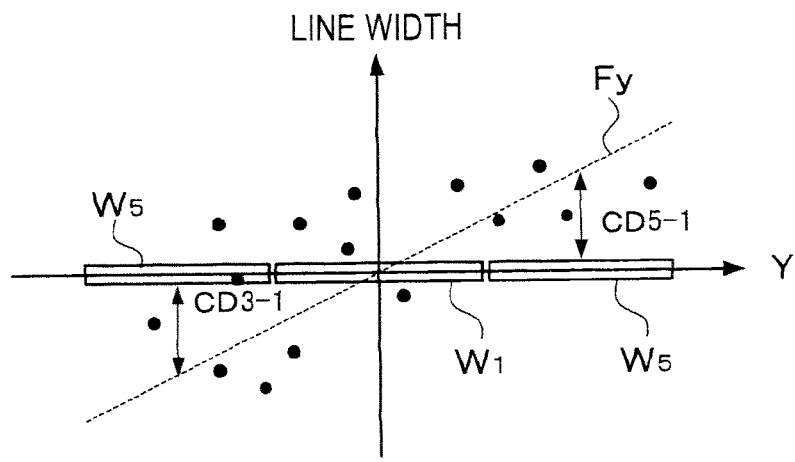
Figure 16:
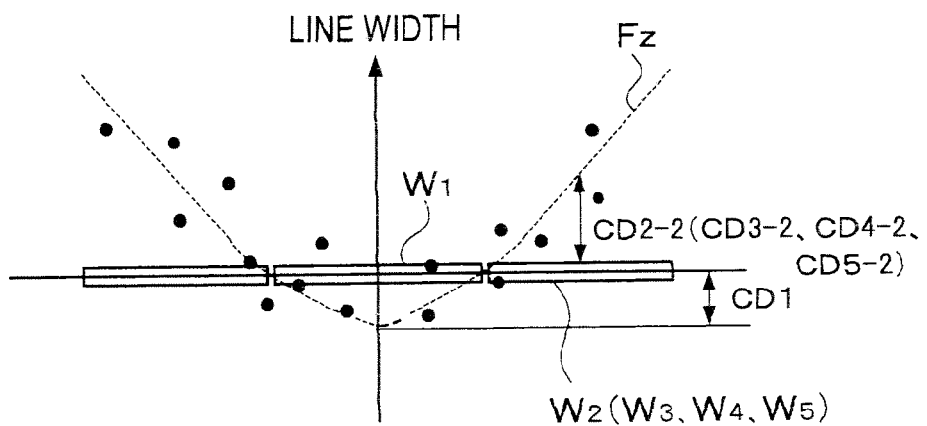

In this case, the gradient component in the X-direction, the gradient component in the Y-direction, and the curvature component are first calculated from the tendency of variations in the line width measured values measured by the line width measuring unit 110. A gradient component Fx in the X-direction is calculated using the least square method, for example, from the distribution of the line width measured values projected on the vertical surface including the X-axis as shown in FIG. 14. Further, a gradient component Fy in the Y-direction is calculated using the least square method from the distribution of the line width measured values projected on the vertical surface including the Y-axis as shown in FIG. 15. Furthermore, a curvature component Fz in a convex form as shown in FIG. 16 is obtained by subtracting the gradient component Fx in the X-direction and the gradient component Fy in the Y-direction from the whole tendency of variations in the line width measured values.

Subsequently, the temperature correction value $\Delta T$ is calculated to eliminate the variation tendency components Fx, Fy, and Fz. For example, from the gradient component Fx in the X-direction, a line width variation amount $\Delta CD_{2-1}$ in the wafer region $W_2$ and a line width variation amount $\Delta CD_{4-1}$ in the wafer region $W_4$ shown in FIG. 14 are calculated. Further, from the gradient component Fy in the Y-direction, for example, a line width variation amount $\Delta CD_{3-1}$ in the wafer region $W_3$ and a line width variation amount $\Delta CD_{5-1}$ in the wafer region $W_5$ shown in FIG. 15 are calculated. Further, from the curvature component Fz, for example, a line width variation amount $\Delta CD_1$ in the wafer region $W_1$ at the central portion of the wafer and line width variation amounts $\Delta CD_{2-2}$, $\Delta CD_{3-2}$, $\Delta CD_{4-2}$, and $\Delta CD_{5-2}$ in the wafer regions $W_2$ to $W_5$ at the wafer outer peripheral portion shown in FIG. 16 are calculated. For example, the line width variation amounts in the variation tendency components Fx, Fy, and Fz are added to each of the wafer regions to calculate the line width variation amounts $\Delta CD_1$, $\Delta CD_2$ ($\Delta CD_{2-1}+\Delta CD_{2-2}$), $\Delta CD_3$ ($\Delta CD_{3-1}+\Delta CD_{3-2}$), $\Delta CD_4$ ($\Delta CD_{4-1}+\Delta CD_{4-2}$), and $\Delta CD_5$ ($\Delta CD_{5-1}+\Delta CD_{5-2}$) in the wafer regions.

Each of the calculated line width variation amounts $\Delta CD_1$ to $\Delta CD_5$ is substituted into the above-described relational expression (1) to calculate the temperature correction value $\Delta T$ by the calculation model M. This calculates the temperature correction value $\Delta T$ which brings each of the line width variation amounts $\Delta CD_1$ to $\Delta CD_5$ to zero and brings the variation tendency components Fx, Fy, and Fz to zero, that is, the temperature correction value $\Delta T$ which eliminates variations in the line width within the wafer.

Note that the calculation process of the above-described temperature correction value $\Delta T$ is embodied, for example, by executing the programs stored in the program storage unit 203 of the temperature setting apparatus 190.

According to this example, the line width measured values measured at many measurement points within the wafer are divided into three variation tendency components Fx, Fy and Fz, based on which the temperature correction value $\Delta T$ is calculated to eliminate the variation tendency components Fx, Fy and Fz. This ensures that the temperature correction value $\Delta T$ is easily found.

The temperature correction value $\Delta T$ for each of the thermal plate regions $R_1$ to $R_5$ calculated in the above embodiment may be set for each processing recipe which is determined by the combination of at least the thermal processing temperature in the PEB unit 84 and the kind of the resist solution. More specifically, for the processing recipe different either in the thermal processing temperature or the kind of the resist solution, a different calculation model M may be used to set a different temperature correction value $\Delta T$. For example, as shown in FIG. 17, when a processing recipe H (a heating temperature T1 and a resist solution B1), a processing recipe I (a heating temperature T1 and a resist solution B2), a processing recipe J (a heating temperature T2 and a resist solution B1), and a processing recipe K (a heating temperature T2 and a resist solution B2) which are different in the heating temperature or the resist solution are set, a calculation model $M_1$, $M_2$, $M_3$, or $M_4$ is set for each of the processing recipes H to K so that the temperature correction value for each of the thermal plate regions $R_1$ to $R_5$ is calculated and set. In this case, even if the resist solution is changed and the processing recipe is thus changed, the wafer W is thermally processed at an optimal temperature according to the processing recipe, thus ensuring the uniformity of the line width of the resist pattern within the wafer.

Figures 18, 19, 20, 21:
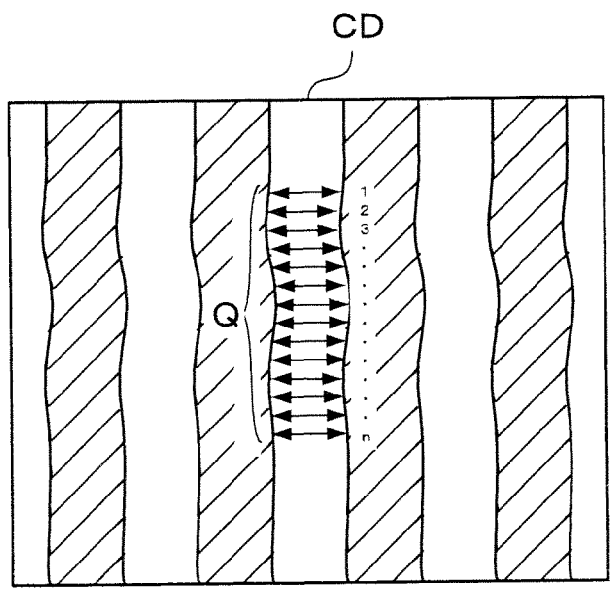

The calculation model M described in the above embodiment may be separated, for example, into a model component $\alpha$ effected by the resist solution and a model component Mt effected by the processing conditions other than the resist solution as shown in FIG. 18. The processing conditions other than the resist solution referred here include, for example, the processing temperature, the processing time, and the state of a processing apparatus which affect the line width. In this case, when the resist solution is changed and the calculation model M is thus changed to a different one, for example, according to the processing recipe, it is only necessary to change only the model component α in the calculation model M. Besides, when the processing condition other than the resist solution such as the processing temperature is changed, it is only necessary to change only the model component Mt in the calculation model M. In this manner, the change of the resist solution and the change of the processing temperature can be flexibly and rapidly responded.

Further, the model component Mt may be separated into a model component Mt1 effected by the exposure processing conditions in the photolithography process and a model component Mt2 effected by the processing conditions other than the exposure processing conditions as shown in FIG. 19. The exposure processing conditions referred here include, for example, exposure amounts (a dose amount and a focus amount) and condition of the aligner which affect the line width, and the processing conditions other than the exposure processing conditions include, for example, the heating time and the heating temperature of the heating processing in the PEB unit and the state of the PEB unit which affect the line width. In this case, for example, when a poor condition occurs in the aligner, the poor condition can be addressed by changing only the model component Mt1.

Incidentally, the result of line width measurement of the wafer W performed by the above-described line width measuring unit 110 may contain a measurement error due to the measurement accuracy of the line width measuring unit 110 and a process error due to a slight fluctuation of the process state of the processing unit or the like during the wafer processing. Though the calculation model M described in the above embodiment is created by the correlation between the previously-measured line width variation amount of each of the wafer regions and the temperature correction value, the aforementioned measurement error and process error may be added in creating the calculation model M. For example, the line width measuring unit 110 is used to measure one wafer W having a resist pattern formed thereon more than once to find variations in the measured values, such as a standard deviation, so that the standard deviation is reflected in each element of the calculation model M using a Kalman filter. This allows for creation of the calculation model M taking the measurement error into consideration in advance. Further, the line width measuring unit 110 is used to measure a plurality of wafers W each having a resist pattern formed thereon by the same processing recipe in a single wafer mode to find variations in the measured values, such as a standard deviation. The standard deviation is reflected in each element of the calculation model M using a Kalman filter. This allows for creation of the calculation model M taking the process error into consideration in advance.

If the line width measuring unit 110 is of an electron beam system (CD-SEM), application of electron beams to the same resist pattern a plurality of number of times will vary the line width of the resist pattern due to the electron beams. Thus, the measurement error of the line width measuring unit 110 cannot be accurately detected. Hence, the measurement error of the line width measuring unit 110 may be detected by the line width measurement of one wafer W. For example, the line width measuring unit 110 measures the line width at the measurement point Q by dividing a micro region at the measurement point Q within the wafer into a plurality of portions as shown in FIG. 20, detecting the line width in each of the divided portions, and calculating an average value of them. In this case, a measurement accuracy d may be calculated by a theoretical expression (2) which is derived from a general expression to determine the magnitude of a sample in FIG. 21. The σ in the theoretical expression (2) is a standard deviation of the line width in the micro region, $Z_{\alpha/2}=1.96$ (Z: an inverse function of normal calculative distribution, and when α=0.05 (a confidential probability of 95%)), and n is the number of divisions. The calculated measurement accuracy d is reflected in the calculation model M. In this case, since the measurement error can be detected by one line width measurement, the accurate measurement error can be detected even in the case using electron beams. Further, the detection of the measurement error can be performed simply and rapidly.

When the line widths in the wafer regions $W_1$ to $W_5$ within the wafer are measured, and the temperature correction values are set for the thermal plate regions $R_1$ to $R_5$ corresponding to the wafer regions W1 to W5 respectively as in the above embodiment, it is necessary that the orientation of the wafer W when mounted on the thermal plate 140, that is, a notch position of the wafer W is fixed. This is because if the orientation of the wafer W on the thermal plate 140 shifts, the thermal plate regions corresponding to the wafer regions for the measured line widths cannot be identified. The alignment of the notch position of the wafer W is performed at the time of exposure processing in the photolithography process in the coating and developing treatment system 1. However, the notch position of the wafer W can shift between the exposure processing and the post-exposure baking. Hence, during that time, the wafer W may be transferred to a unit having an alignment function, for example, the edge exposure unit 94, subjected to alignment again there, and then transferred into the PEB unit. Alternatively, a CCD camera as a detection member for detecting the notch position of the wafer W may be attached to the PEB unit so that the shift of the notch position of the wafer W is detected when the wafer W is transferred into the PEB unit. In addition, when the notch position of the wafer W is shifted, the shift of the notch position may be reflected, for example, in the calculation model M to calculate the temperature correction values for the thermal plate regions $R_1$ to $R_5$ corresponding to the positions of the line width measurement. This ensures that the temperature setting of the thermal plate regions $R_1$ to $R_5$ is appropriately performed.

An example of the embodiment of the present invention has been described above, but the present invention is not limited to the embodiment and may take various forms. For example, while the temperature-set thermal plate 140 is divided into five regions in the above embodiment, any number of divisions can be selected. Besides, while the above embodiment is an example in which the thermal plate 140 of the PEB unit 84 is temperature-set, the present invention is also applicable to other heating processing units with a thermal plate, such as a pre-baking unit and a post-baking unit, and to a cooling processing unit with a cooling plate for cooling the wafer W mounted thereon. Furthermore, the present invention is also applicable to temperature setting of a thermal processing plate for thermally processing substrates other than the wafer, such as an FPD (Flat Panel Display), a mask reticle for a photomask, and the like.

INDUSTRIAL APPLICABILITY

The present invention is useful in setting the temperature of a thermal processing plate to form the line width of a resist pattern uniform within a substrate.

What is claimed:

1. A temperature setting method of a thermal processing plate for mounting and thermally processing a substrate thereon, the method comprising:
   performing the thermal processing in a photolithography process of forming a resist pattern on the substrate, the resist pattern including a plurality of lines,
   wherein the thermal processing plate is divided into a plurality of regions and the temperature for each of the regions is settable;
   setting a temperature correction value for adjusting a temperature within the substrate on the thermal processing plate for each of the regions of the thermal processing plate after calculation by a calculation model created from a correlation between a line width of the lines of the resist pattern formed by thermal processing on the thermal processing plate and the temperature correction value,
   wherein the line width of the lines of the resist pattern is measured at a plurality of line width measurement points on the substrate;
   obtaining variation tendency components from a tendency of variations in values of the line width measurement within the substrate presented by describing, in a height direction, the values of the line width measurement and projecting the values onto a plane vertical to the substrate surface, the variation tendency components including
   (i) a gradient component in an X-direction within the substrate,
   (ii) a gradient component in a Y-direction perpendicular to the X-direction within the substrate, and
   (iii) a curvature component within the substrate,
   wherein the calculation model calculates the temperature correction value to decrease the variation tendency components, based on a line width measured value of the lines of the resist pattern within the substrate; and
   adjusting the temperature of each of the plurality of regions based on the respective temperature correction value.

2. The temperature setting method of a thermal processing plate as set forth in claim 1,
   wherein the gradient component in the X-direction and the gradient component in the Y-direction are found by a least square method from the plurality of line width measured values within the substrate, and
   wherein the curvature component is found by subtracting the gradient component in the X-direction and the gradient component in the Y-direction from the tendency of the line width measured values within the substrate.

3. The temperature setting method of a thermal processing plate as set forth in claim 1,
   wherein the calculation model is separated into one model component determined by a resist solution and another model component determined by a processing condition other than the resist solution.

4. The temperature setting method of a thermal processing plate as set forth in claim 3,
   wherein the model component determined by a processing condition other than the resist solution is further separated into a first model component determined by an exposure processing condition in the photolithography process and a second model component determined by a processing condition other than the exposure processing condition.

5. The temperature setting method of a thermal processing plate as set forth in claim 1,
   wherein the temperature correction value for each of the region is set for each processing recipe determined by a combination of at least a thermal processing temperature and a kind of the resist solution.

6. The temperature setting method of a thermal processing plate as set forth in claim 1,
   wherein the thermal processing is heating processing performed after exposure processing and before a developing treatment.

7. A non-transitory computer readable storage medium including program code instructions for causing a temperature setting apparatus to execute the method of claim 1.

8. The temperature setting method of a thermal processing plate as set forth in claim 1, wherein the calculation model incorporates a determinant based on elements obtained by measuring line width variation amounts of the plurality of regions when the temperature of an arbitrary thermal plate region of the plurality of regions is changed by 1°.

9. A temperature setting apparatus of a thermal processing plate for mounting and thermally processing a substrate thereon, the temperature setting apparatus comprising:
   a computing unit;
   an input unit; and
   a data storage unit that stores a calculation model that calculates a temperature correction value;
   wherein the thermal processing is performed in a photolithography process of forming a resist pattern on the substrate, the resist pattern including a plurality of lines,
   wherein said thermal processing plate is divided into a plurality of regions and the temperature for each of the regions is settable,
   wherein the computing unit sets the temperature correction value for adjusting a temperature within the substrate on said thermal processing plate for each of the regions of said thermal processing plate after calculation by a calculation model created from a correlation between a line width of the lines of the resist pattern formed by thermal processing on said thermal processing plate and the temperature correction value,
   wherein the line width of the lines of the resist pattern is measured at a plurality of line width measurement points on the substrate,
   wherein the calculation model calculates the temperature correction value to decrease variation tendency components which are obtained from a tendency of variations in the line width measured values within the substrate presented by describing, in a height direction, the line width measured values at a plurality of line width measurement points within the substrate, said variation tendency components including
   (i) a gradient component in an X-direction within the substrate,
   (ii) a gradient component in a Y-direction perpendicular to the X-direction within the substrate, and
   (iii) a curvature component within the substrate, and
   wherein the temperature setting apparatus sets the temperature of each of the plurality of regions based on the respective temperature correction value for each of the plurality of regions.

10. The temperature setting apparatus of a thermal processing plate as set forth in claim 9,
    wherein the gradient component in the X-direction and the gradient component in the Y-direction are found by a least square method from the plurality of line width measured values within the substrate, and
    wherein the curvature component is found by subtracting the gradient component in the X-direction and the gradient component in the Y-direction from the tendency of the line width measured values within the substrate.

11. The temperature setting apparatus of a thermal processing plate as set forth in claim 9,
  wherein the calculation model is separated into one model component determined by a resist solution and another model component determined by a processing condition other than the resist solution.

12. The temperature setting apparatus of a thermal processing plate as set forth in claim 11,
  wherein the model component determined by a processing condition other than the resist solution is further separated into a first model component determined by an exposure processing condition in the photolithography process and a second model component determined by a processing condition other than the exposure processing condition.

13. The temperature setting apparatus of a thermal processing plate as set forth in claim 9,
  wherein the temperature correction value for each of the regions is set for each processing recipe determined by a combination of at least a thermal processing temperature and a kind of the resist solution.

14. The temperature setting apparatus of a thermal processing plate as set forth in claim 9,
  wherein the thermal processing is heating processing performed after exposure processing and before a developing treatment.

* * * * *